(12) United States Patent
Lee et al.

(10) Patent No.: US 9,747,682 B2
(45) Date of Patent: Aug. 29, 2017

(54) METHODS FOR MEASURING OVERLAYS (71) Applicant: SAMSUNG ELECTRONICS CO., LTD., Suwon-si, Gyeonggi-do (KR)

(72) Inventors: Jeongjin Lee, Asan-si (KR); Chan Hwang, Seoul (KR); Seungyoon Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 4 days.

(21) Appl. No.: 14/940,880

(22) Filed: Nov. 13, 2015

(65) Prior Publication Data
US 2016/0071255 A1 Mar. 10, 2016

Related U.S. Application Data (63) Continuation of application No. 14/182,697, filed on Feb. 18, 2014.

(30) Foreign Application Priority Data

Mar. 8, 2013 (KR) ........................ 10-2013-0025091

(51) Int. Cl.
| | |
|---|---|
| G06T 7/00 | (2017.01) |
| G03F 7/20 | (2006.01) |
| H04N 5/225 | (2006.01) |
| H04N 5/33 | (2006.01) |
| G06T 7/174 | (2017.01) |

(52) U.S. Cl.
CPC .......... *G06T 7/001* (2013.01); *G03F 7/70633* (2013.01); *G06T 7/174* (2017.01); *H04N 5/2256* (2013.01); *H04N 5/332* (2013.01); *G06T 2207/10048* (2013.01); *G06T 2207/10152* (2013.01); *G06T 2207/30148* (2013.01); *G06T 2207/30204* (2013.01)

(58) Field of Classification Search
None
See application file for complete search history.

(56) References Cited

U.S. PATENT DOCUMENTS

| | | | |
|---|---|---|---|
| 6,919,152 B2* | 7/2005 | Sreenivasan | ........ B29C 35/0888 101/130 |
| 7,177,457 B2 | 2/2007 | Adel et al. | |
| 7,525,089 B2* | 4/2009 | Choi | ..................... H01J 37/222 250/307 |

(Continued)

FOREIGN PATENT DOCUMENTS

| | | |
|---|---|---|
| KR | 1020050116759 | 12/2005 |
| KR | 1020070077687 | 7/2007 |

(Continued)

*Primary Examiner* — Kim Vu
*Assistant Examiner* — Molly Delaney
(74) *Attorney, Agent, or Firm* — F. Chau & Associates, LLC (57) ABSTRACT A method for measuring overlay includes receiving a first image of a first overlay mark captured using light having a first wavelength. The method includes receiving a second image of a second overlay mark captured using light having a second wavelength different from the first wavelength. The method includes measuring a displacement between a central portion of the first image and a central portion of the second image, wherein the first and second overlay marks are disposed on different levels.

18 Claims, 11 Drawing Sheets

(56) References Cited

U.S. PATENT DOCUMENTS

| | | | | |
|---|---|---|---|---|
| 7,541,201 | B2* | 6/2009 | Ghinovker | G03F 7/70633 257/E23.179 |
| 8,148,682 | B2* | 4/2012 | Hotta | G03F 7/70466 250/307 |
| 8,930,011 | B2* | 1/2015 | Heo | G03F 7/70633 382/151 |
| 2003/0021467 | A1* | 1/2003 | Adel | G03F 7/70633 382/151 |
| 2004/0124566 | A1* | 7/2004 | Sreenivasan | B81C 1/0046 264/494 |
| 2004/0169861 | A1* | 9/2004 | Mieher | G01N 21/956 356/400 |
| 2006/0274312 | A1* | 12/2006 | Endo | G03F 7/70633 356/400 |
| 2007/0035039 | A1 | 2/2007 | Hyun-Tae | |
| 2007/0077503 | A1* | 4/2007 | Yoo | G03F 7/70633 430/22 |
| 2008/0144036 | A1* | 6/2008 | Schaar | H01L 22/12 356/446 |
| 2008/0187211 | A1* | 8/2008 | Hyon | G06K 9/64 382/145 |
| 2009/0170024 | A1* | 7/2009 | Hennig | G03F 7/70633 430/270.1 |
| 2011/0320025 | A1* | 12/2011 | Heo | G03F 7/70633 700/98 |
| 2012/0206703 | A1 | 8/2012 | Bhattacharyya et al. | |
| 2013/0208279 | A1* | 8/2013 | Smith | G01B 11/26 356/401 |
| 2013/0321811 | A1* | 12/2013 | Maeda | G01B 11/14 356/400 |

FOREIGN PATENT DOCUMENTS

| | | |
|---|---|---|
| KR | 1020080092553 | 10/2008 |
| KR | 1020100134417 | 12/2010 |
| KR | 1020110001804 | 1/2011 |

* cited by examiner

METHODS FOR MEASURING OVERLAYS

CROSS-REFERENCE TO RELATED APPLICATIONS

This U.S. nonprovisional patent application is a continuation of U.S. patent application Ser. No. 14/182,697, filed on Feb. 18, 2014 which claims priority under 35 U.S.C. §119 to Korean Patent Application No. 10-2013-0025091 filed on Mar. 8, 2013, the disclosures of which are incorporated by reference herein in their entireties.

TECHNICAL FIELD

The present inventive concept relates to a method for measuring overlays and, more particularly, to a method for measuring overlay errors using image based overlay measurement techniques.

DISCUSSION OF RELATED ART

In semiconductor manufacturing processes, there is a need for measuring and controlling specific wafer parameters. Overlay error is one of the wafer parameters. Overlay error can be referred to as a relative displacement between structures formed on different layers in the wafer. The larger the overlay error is between structures, the greater the misalignment is between the structures. The yield and performance of semiconductor devices can be decreased due to overlay error.

SUMMARY

Exemplary embodiments of the present inventive concept provide a method for measuring overlay errors using different wavelengths.

Exemplary embodiments of the present inventive concept provide a method for measuring overlay errors in which an image corresponding to overlay marks formed on a lower layer is acquired using light having a longer wavelength and an image corresponding to another overlay mark formed on an upper layer is acquired using light having a shorter wavelength.

According to an exemplary embodiment of the present inventive concept, a method for measuring overlay includes receiving a first image of a first overlay mark captured using light having a first wavelength and a second image of a second overlay mark captured using light having a second wavelength different from the first wavelength. The method for measuring overlay includes measuring a displacement between a central portion of the first image and a central portion of the second image, wherein the first overlay mark and the second overly mark are disposed on different levels.

According to an exemplary embodiment of the present inventive concept, the first overlay mark may be provided on a lower level than the second overlay mark, and the first wavelength may be longer or shorter than the second wavelength.

According to an exemplary embodiment of the present inventive concept, at least one of the first and second wavelengths may be included in a range of visible light, a range above the range of visible light, or a range below the range of visible light.

According to an exemplary embodiment of the present inventive concept, the first overlay mark may be disposed on a first layer of a wafer, and the second overlay mark may be disposed on a second layer over the first layer of the wafer.

According to an exemplary embodiment of the present inventive concept, the first and second overlay marks may be provided on a scribe lane of the wafer.

According to an exemplary embodiment of the present inventive concept, a method for measuring overlay may include receiving a first image corresponding to a first overlay mark captured using light having a first wavelength, the first overlay mark disposed on a first layer of a wafer. The method for measuring overlay may include receiving a second image corresponding to a second overlay mark captured using light having a second wavelength different from the first wavelength, the second overlay mark disposed on a second layer over the wafer. The method for measuring overlay may include receiving a combined image in which the first and second images are overlapped. The method for measuring overlay may include calculating a displacement between a central portion of the first image and a central portion of the second image in the combined image to measure an overlay between the first overlay mark and the second overlay mark.

According to an exemplary embodiment of the present inventive concept, the first wavelength may be longer or shorter than the second wavelength.

According to an exemplary embodiment of the present inventive concept, the method may further include receiving a third image corresponding to a third overlay mark captured using light having a third wavelength. The third overlay mark may be provided on a third layer over the second layer. The third wavelength may be different from the first and second wavelengths.

According to an exemplary embodiment of the present inventive concept, the first wavelength may be longer or shorter than the second wavelength, and the second wavelength may be longer or shorter than the third wavelength.

According to an exemplary embodiment of the present inventive concept, the first overlay mark may be disposed on the first layer that corresponds to a scribe lane of the wafer. The second overlay mark may be disposed on the second layer that corresponds to the scribe lane of the wafer.

According to an exemplary embodiment of the present inventive concept, one of the first and second overlay marks may be horizontally spaced apart from the other and may be not vertically overlapped with the other.

According to an exemplary embodiment of the present inventive concept, the second layer may be directly on the first layer, or an additional layer may be further disposed between the first and second layers.

According to an exemplary embodiment of the present inventive concept, the first overlay mark may include a plurality of first parallel lines that are spaced apart. The second overlay mark may include a plurality of second parallel lines that are spaced apart.

According to an exemplary embodiment of the present inventive concept, receiving the first image may include selecting the first parallel lines and obtaining an image of the first parallel lines using the light having the first wavelength.

According to an exemplary embodiment of the present inventive concept, capturing the second image may include selecting the second parallel lines and obtaining an image of the second parallel lines using the light having the second wavelength.

BRIEF DESCRIPTION OF THE DRAWINGS

The above and other features of the inventive concept will become more apparent by describing in detail exemplary embodiments thereof, with reference to the accompanying drawings in which:

FIGS. 3A to 3F are top plan views illustrating a method for measuring overlay according to an exemplary embodiment of the present inventive concept;

DETAILED DESCRIPTION OF THE EMBODIMENTS

Exemplary embodiments of the present inventive concept will now be described more fully hereinafter with reference to the accompanying drawings, in which some exemplary embodiments of the present inventive concept are shown. However, the present inventive concept should not be construed as limited to the exemplary embodiments set forth herein and may be embodied in different forms.

In the drawings, the thicknesses of layers and regions may be exaggerated for clarity. Like reference numerals in the drawings and specification may denote like elements.

Figure 1:
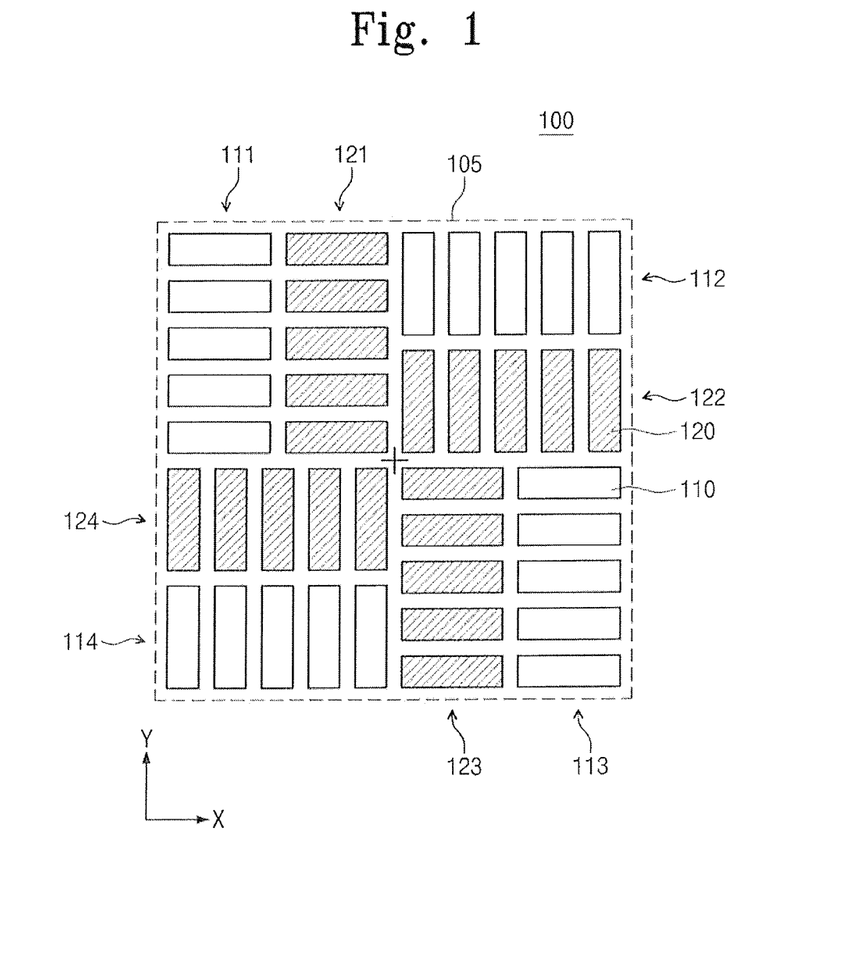
FIG. 1 is a top plan view of an overlay mark according to an exemplary embodiment of the present inventive concept.

FIG. 1 is a top plan view of an overlay mark according to an exemplary embodiment of the present inventive concept.

Referring to FIG. 1, an overlay mark 100 may be formed on a scribe lane of a wafer to be used for determining an overlay between two or more layers stacked on the wafer or between two or more separate patterns on a single layer of the wafer. For ease of discussion, the overlay mark 100 may be mainly used to determine an overlay between two or more layers stacked on a wafer. It should be noted, however, that this is not a limitation and that the overlay mark 100 may also be used to determine an overlay between two or more separate patterns on a single layer of a wafer.

The overlay mark 100 may be arranged within an optical perimeter 105 set by a field of view that defines an area available for capturing an image by a metrology tool used to measure overlay. The overlay mark 100 may comprise a plurality of zones configured to determine overlay errors in X and Y directions between two layers on the wafer. For example, the overlay mark 100 may comprise first zones 111, 112, 113 and 114 that may be provided on a first layer of the wafer and second zones 121, 122, 123 and 124 that may be provided on a second layer over the first layer of the wafer. The first zones 111 to 114 may be horizontally spaced apart from the second zones 121 to 124 and do not vertically overlap the second zones 121 to 124. The second zones 121 to 124 may be positioned closer to a center (represented by a cross) of the optical perimeter 105 than the first zones 111 to 114.

The first zones 111 to 114 may include a first pattern 111, a second pattern 112, a third pattern 113, and a fourth pattern 114 which are rotationally symmetric, for example ±90°, 180°, 270°, 360° around the center of the optical perimeter 105. Each of the first to fourth patterns 111 to 114 may include a plurality of first overlay marks 110. The first overlay marks 110 may be a plurality of parallel lines arranged periodically on the first layer of the wafer. The first overlay marks 110 included in the first and third patterns 111 and 113 may be provided to measure an overlay in the Y direction while the first overlay marks 110 included in the second and fourth patterns 112 and 114 may be provided to measure an overlay in the X direction.

Similarly, the second zones 121 to 124 may include a first pattern 121, a second pattern 122, a third pattern 123, and a fourth pattern 124 which are rotationally symmetric, for example ±90°, 180°, 270°, 360° around the center of the optical perimeter 105. Each of the first to fourth patterns 121 to 124 may include a plurality of second overlay marks 120. The second overlay marks 120 may be a plurality of parallel lines arranged periodically on the second layer of the wafer. In exemplary embodiments of the present inventive concept, the second layer may be disposed directly on the first layer. An additional layer (e.g., additional layer 32 of FIG. 4) may be further disposed between the first and second layers. The second overlay marks 120 included in the first and third patterns 121 and 123 may be provided to measure an overlay in the Y direction while the second overlay marks 120 included in the second and fourth patterns 122 and 124 may be provided to measure an overlay in the X direction.

Figure 2:
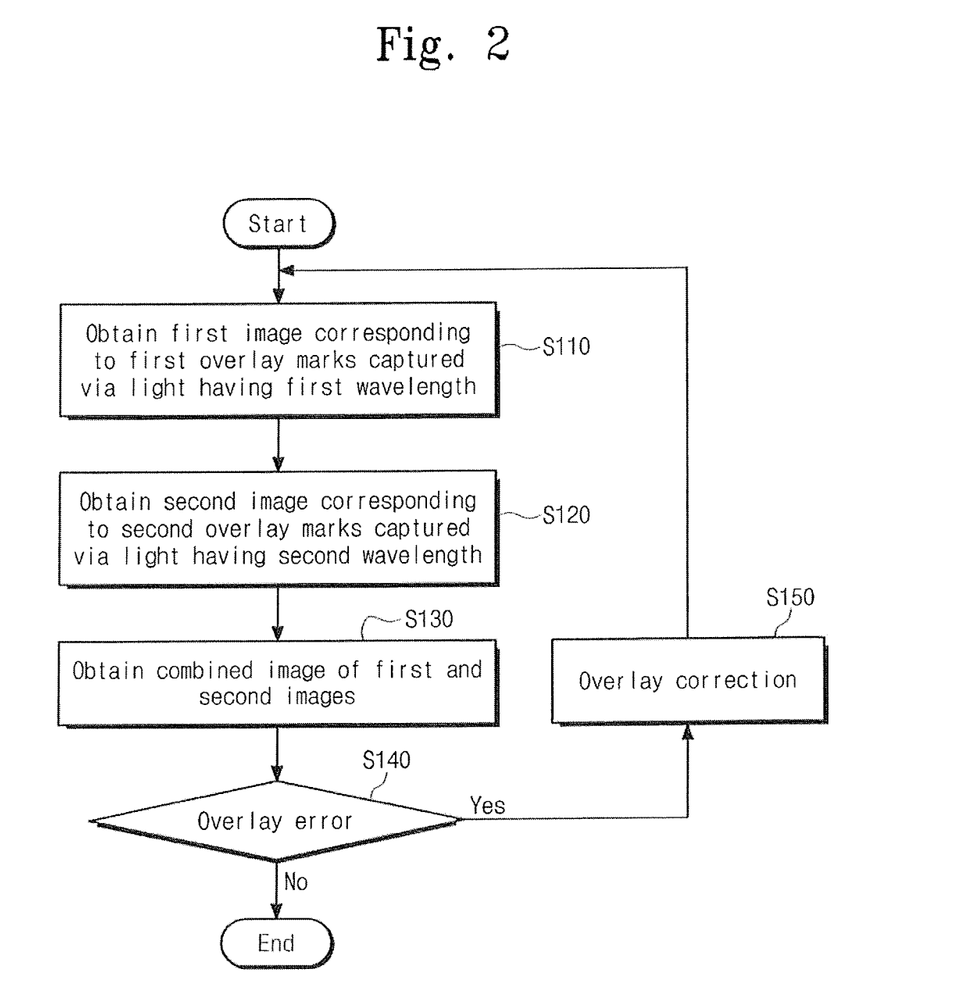
FIG. 2 is a flow diagram illustrating a method for measuring overlay according to an exemplary embodiment of the present inventive concept.

FIG. 2 is a flow diagram illustrating a method for measuring overlay according to an exemplary embodiment of the present inventive concept.

Referring to FIG. 2, a method for measuring an overlay between the first and second layers of the wafer may begin at a first step S110 where a first image (e.g., 110p of FIG. 3A) corresponding to the first zones 111 to 114 is captured using light having a first wavelength. After obtaining the first image 110p, the process may proceed to a second step S120 where a second image (e.g., 120p of FIG. 3B) corresponding to the second zones 121 to 124 is captured using light having a second wavelength. After obtaining the second image 120p, the process may proceed to a third step S130 where a combined image (e.g., 130p of FIG. 3C) of the first and second images 110p and 120p is acquired. After obtaining the combined image 130p, the process may proceed to a fourth step S140 where an overlay error is measured by calculating a displacement or offset between a center (e.g., 110c of FIG. 3A) of the first image 110p and a center (e.g., 120c of FIG. 3B) of the second image 120p. When an overlay error is present, a step S150 may be performed to correct the overlay error. After the overlay correction, the first to fourth steps S110 to S140 may be selectively repeated. The overlay measurement may be further described in detail below.

Figure 3A:
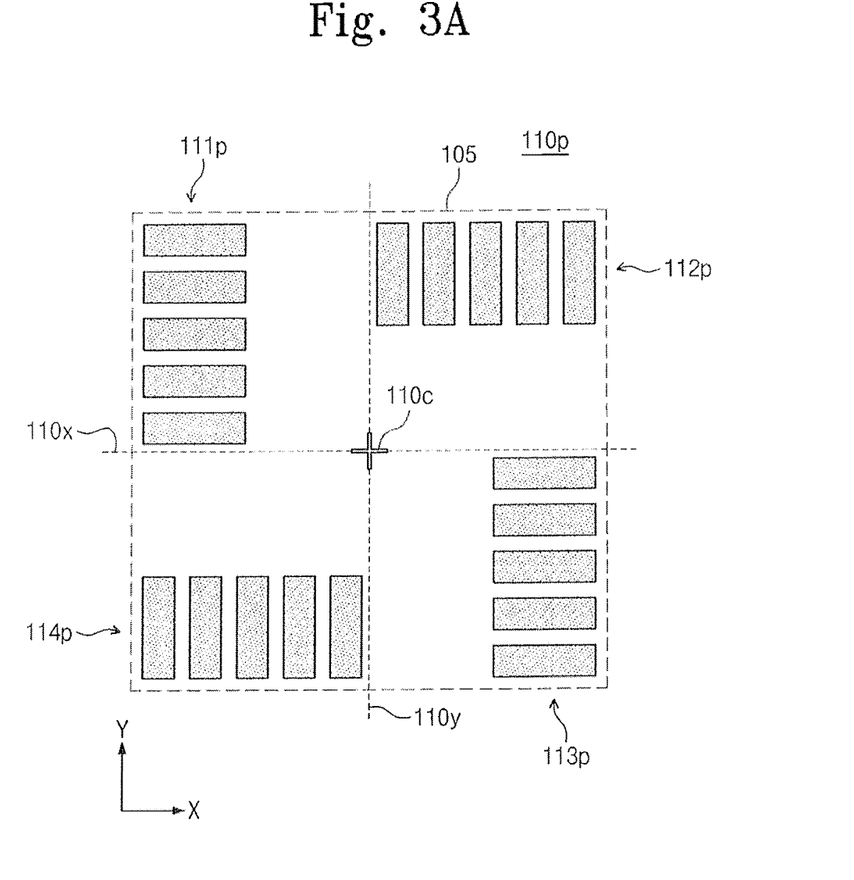
Figure 3B:
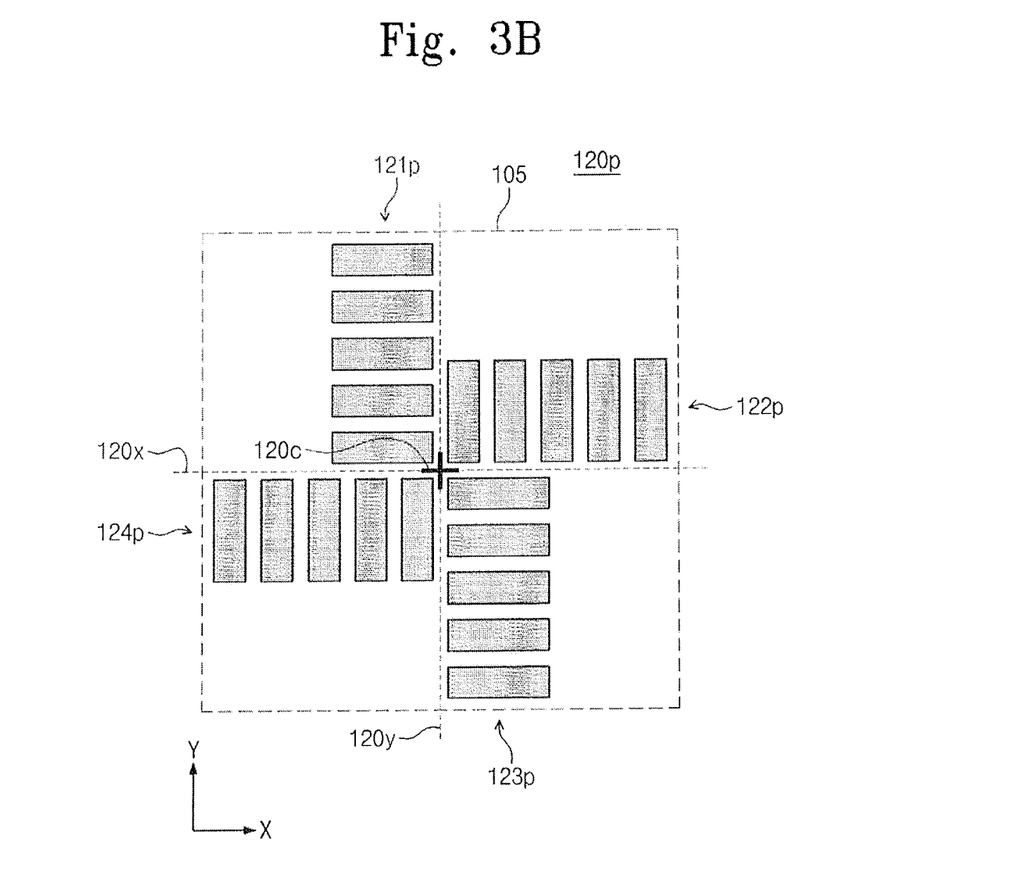
Figure 3C:
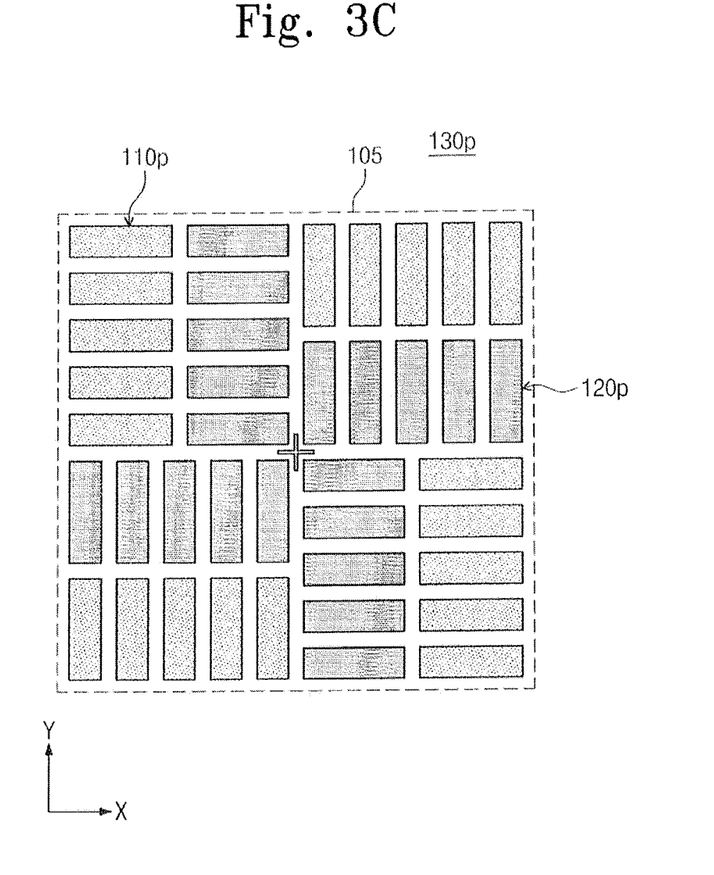
Figure 3D:
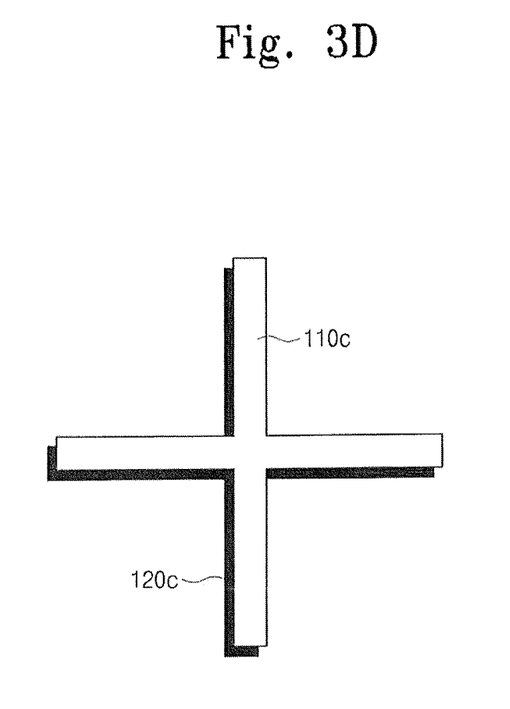
FIG. 3D is a top plan view illustrating a portion of FIG. 3C.
Figure 3E:
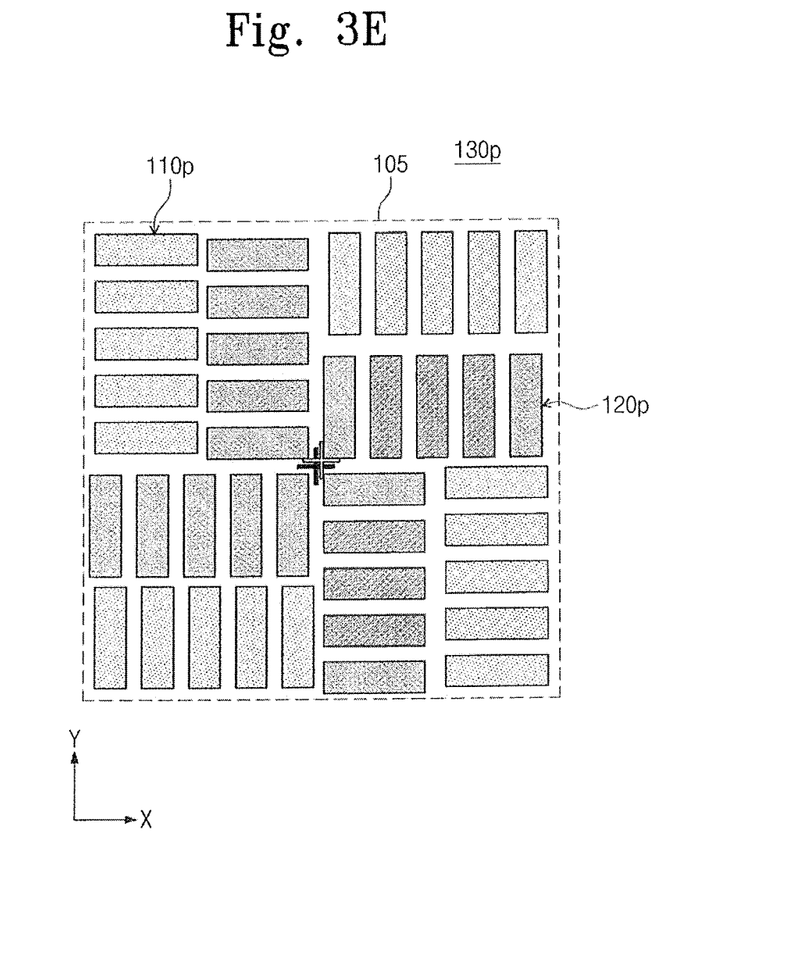
Figure 3F:
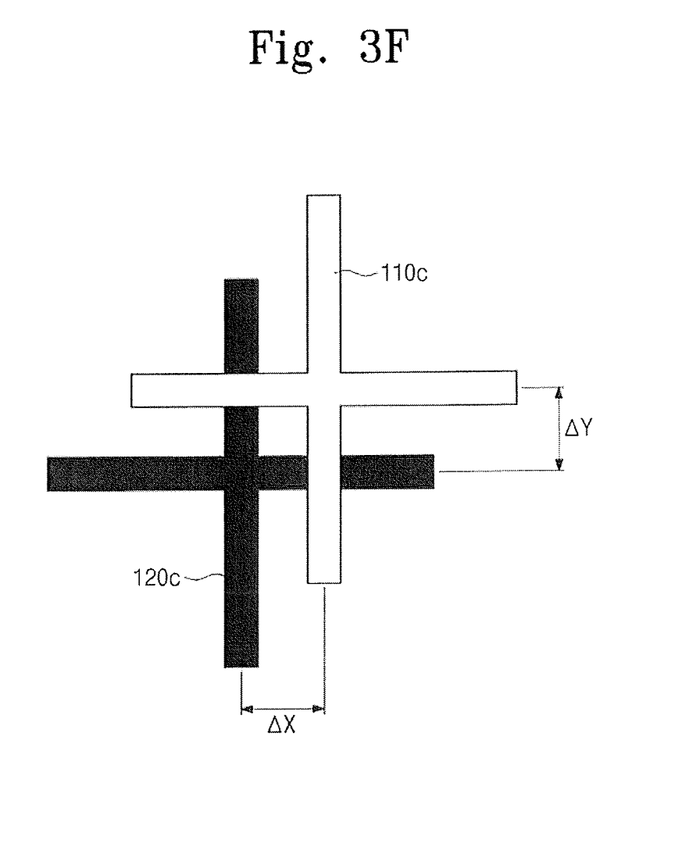
FIG. 3F is a top plan view illustrating a portion of FIG. 3E.
Figure 4:
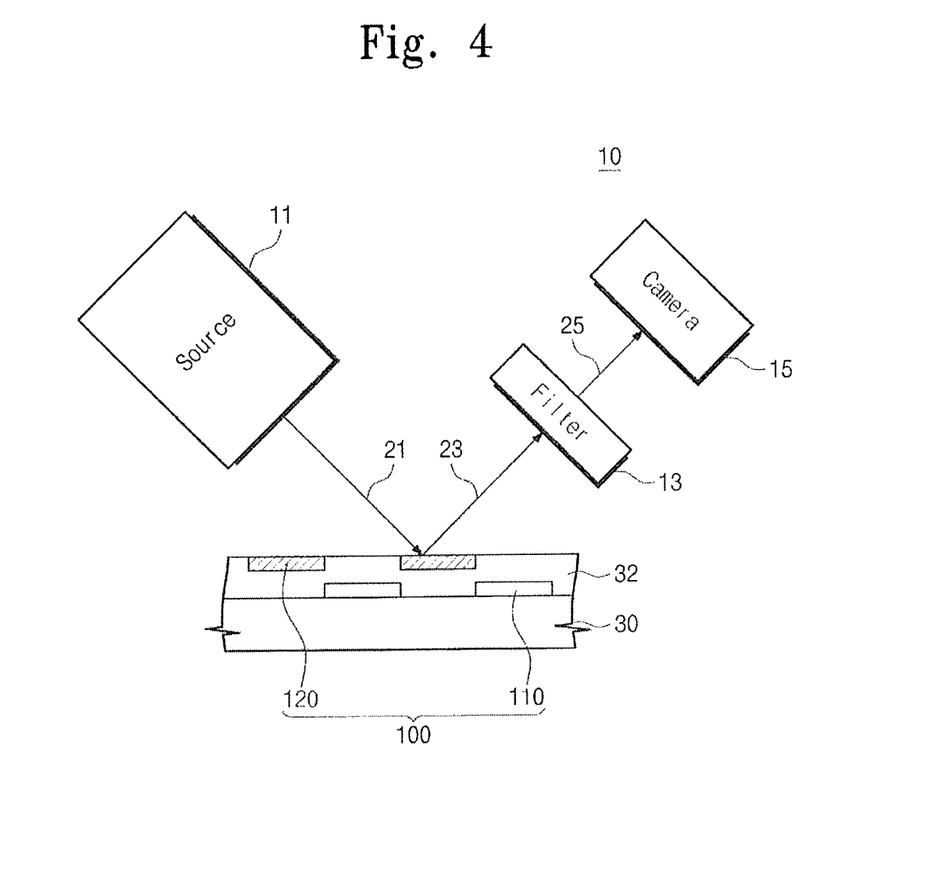
FIG. 4 is a diagram of an overlay measurement system according to an exemplary embodiment of the present inventive concept.

FIGS. 3A to 3F are top plan views illustrating a method for measuring overlay according to an exemplary embodiment of the present inventive concept. FIG. 3D is a top plan view illustrating a portion of FIG. 3C. FIG. 3F is a top plan view illustrating a portion of FIG. 3E. FIG. 4 is a diagram of an overlay measurement system according to an exemplary embodiment of the present inventive concept.

Referring to FIGS. 1 and 3A, a first image 110p may be acquired by selectively capturing the first zones 111 to 114 each having the first overlay marks 110 from the overlay mark 100. The first image 110p may include a first pattern image 111p corresponding to the first pattern 111, a second pattern image 112p corresponding to the second pattern 112, a third pattern image 113p corresponding to the third pattern 113, and a fourth pattern image 114p corresponding to the fourth pattern 114. The first to fourth pattern images 111p to 114p may be rotationally symmetric, for example ±90°, 180°, 270°, 360° around a first image center 110c of the first image 110p.

The first image center 110c may be defined at a cross point between a horizontal line 110x and a vertical line 110y. The horizontal line 110x may run through a middle of the first image 110p along the X direction, e.g., between the first pattern image 111p and the third pattern image 113p. The vertical line 110y may run through a middle of the first image 110p along the Y direction, e.g., between the second pattern image 112p and the fourth pattern image 114p. The horizontal line 110x may be used to measure an overlay along the Y direction while the vertical line 110y may be used to measure an overlay along the X direction.

Referring to FIGS. 1 and 3B, a second image 120p may be acquired by selectively capturing the second zones 121 to 124 each having the second overlay marks 120 from the overlay mark 100. The second image 120p may include a first pattern image 121p corresponding to the first pattern 121, a second pattern image 122p corresponding to the second pattern 122, a third pattern image 123p corresponding to the third pattern 123, and a fourth pattern image 124p corresponding to the fourth pattern 124. The first to fourth pattern images 121p to 124p may be rotationally symmetric, for example 190°, 180°, 270°, 360° around a second image center 120c of the second image 120p.

The second image center 120c may be defined at a cross point between a horizontal line 120x and a vertical line 120y. The horizontal line 120x may run through a middle of the second image 120p along the X direction, e.g., between the first pattern image 121p and the third pattern image 123p. The vertical line 120y may run through a middle of the first image 110p along the Y direction, e.g., between the second pattern image 122p and the fourth pattern image 124p. The horizontal line 120x may be used to measure an overlay along the Y direction while the vertical line 120y may be used to measure an overlay along the X direction.

The first image 110p and the second image 120p may be acquired by an overlay measurement system or metrology tool 10 that can select two or more wavelengths as described, for example, in FIG. 4. With reference to FIG. 4, the overlay measurement system 10 may include a light source 11 for emitting incident light 21 towards a wafer 30, a filter 13 for selectively passing a portion of output light 23 scattered from the wafer 30, and a camera 15 for generating an image of the overlay mark 100 based on filtered output light 25. The filter 13 may be configured to selectively allow particular colors to pass such as red, yellow, green, or blue. The overlay mark 100 may be provided on the wafer 30. The first overlay marks 110 may be formed on a first layer and the second overlay marks 120 may be formed on a second layer over the first layer of the wafer 30. An additional layer 32 may be interposed between the first and second layers of the wafer 30. The additional layer 32 may be a single layer or multiple layers.

The first overlay marks 110 may be disposed below one or more additional layers 32. Therefore, the first image 110p may be acquired based on light that passes through one or more additional layers 32. The second image 120p may be acquired based on light that does not pass through the additional layer 32. There may be thickness differences between the first and second layers of the wafer 30. Different wavelengths may be used to generate clear first and second images 110p and 120p, respectively.

According to an exemplary embodiment of the present inventive concept, the first image 110p may be obtained by selecting and capturing the first overlay marks 110 based on light having a first wavelength. The second image 120p may be obtained by selecting and capturing the second overlay marks 120 based on light having a second wavelength different from the first wavelength. For example, the second wavelength may be shorter than the first wavelength. In other words, light used to obtain the first image 110p may have a wavelength longer than that of light used to obtain the second image 120p. Alternatively, the first wavelength may be shorter than the second wavelength.

For example, the light used to capture the first image 110p may have red color in a range of visible light and the light used to capture the second image 120p may have blue color in the range of visible light. Alternatively, at least one of the light for capturing the first image 110p and the light for capturing the second image 120p may be from a range of visible light, a range (e.g., infrared rays) longer than that of visible light, or a range (e.g., ultraviolet rays) shorter than that of visible light. The first image 110p may be acquired by entirely selecting and capturing the overlay mark 100 based on light having the first wavelength, for example light having red color. In this case, clearness of an image corresponding to the first overlay marks 110 may be greater than that of an image corresponding to the second overlay marks 120. The second image 120p may be acquired by entirely selecting and capturing the overlay mark 100 based on light having the second wavelength, for example light having blue color. In this case, clearness of an image corresponding to the second overlay marks 120 may be greater than that of an image corresponding to the first overlay marks 110.

Referring to FIGS. 3C and 3D, there may be acquired a combined image 130p in which one of the first and second images 110p and 120p lies on top of the other. If there is zero overlay error, the first image center 110c may coincide with the second image center 120c.

Referring to FIGS. 3E and 3F, if there is an overlay error, the position of the first image center 110c may be inconsistent with the position of the second image center 120c. An X-directional overlay error ΔX and a Y-directional overlay error ΔY may be determined by calculating a displacement between the first image center 110c and the second image center 120c.

Figure 5:
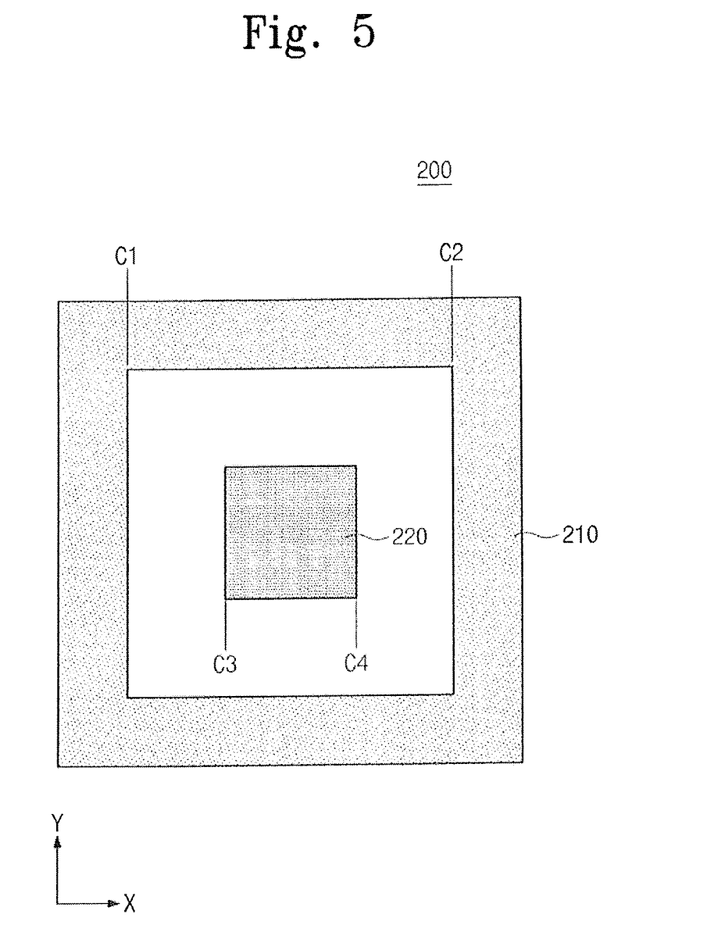
FIG. 5 is a top plan view of an overlay mark according to an exemplary embodiment of the present inventive concept.
Figure 6:
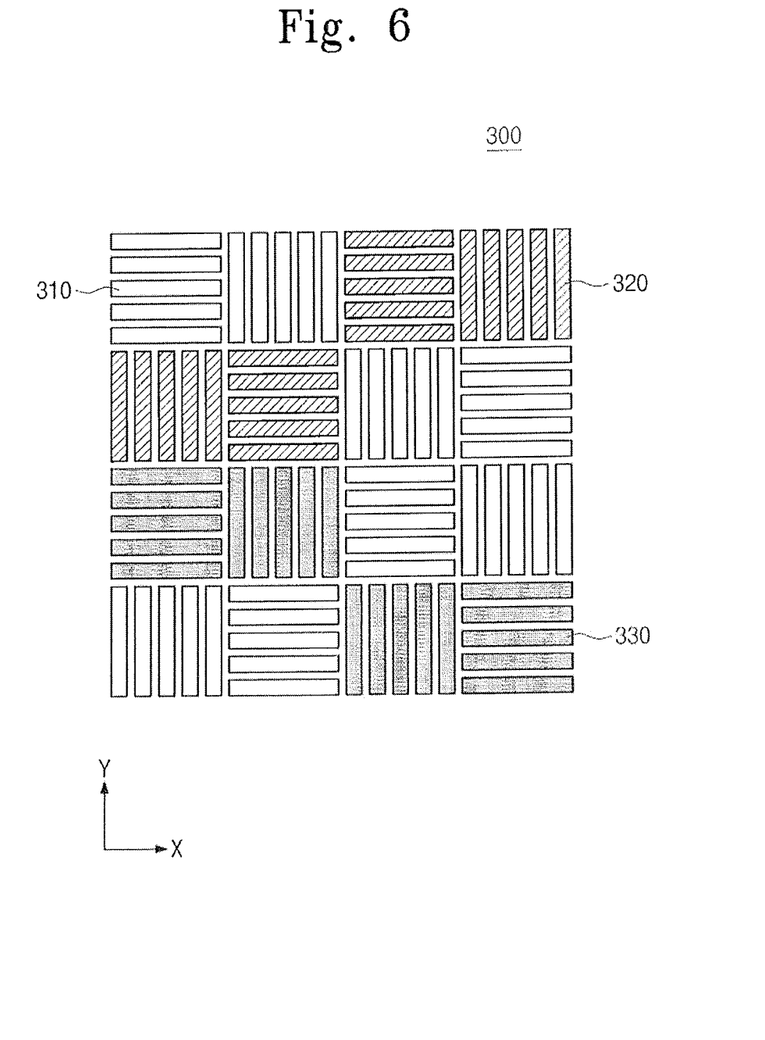
FIG. 6 is a top plan view of an overlay mark according to an exemplary embodiment of the present inventive concept.

FIG. 5 is a top plan view of an overlay mark according to an exemplary embodiment of the present inventive concept. FIG. 6 is a top plan view of an overlay mark according to an exemplary embodiment of the present inventive concept.

Referring to FIG. 5, an overlay mark 200 may include a first overlay mark 210 in a shape of an open-centered box and a second overlay mark 220 in a shape of a closed box. For example, the first overlay mark 210 may be disposed on a first layer of a wafer and the second overlay mark 220 may be disposed on a second layer over the first layer of the wafer. The first overlay mark 210 may surround the second overlay mark 220.

A first image of the first overlay mark 210 may be acquired based on light having a first wavelength, a second image of the second overlay mark 220 may be acquired based on light having a second wavelength different from the first wavelength. A combined image may be acquired by overlapping the first and second images. An overlay error may be determined by calculating displacements between lines C1 and C2 corresponding to opposing inner edges of the first overlay mark 210 and lines C3 and C4 corresponding to opposing outer edges of the second overlay mark 220. The first wavelength may be longer or shorter than the second wavelength.

For example, if a distance between the lines C1 and C3 is substantially identical to a distance between the lines C2 and C4, an overlay error along an X direction may be zero. An overlay error along a Y direction may also be determined using the above technique.

Referring to FIG. 6, an overlay mark 300 may include first overlay marks 310 provided on a first layer of a wafer, second overlay marks 320 provided on a second layer over the first layer, and third overlay marks 330 provided on a third layer over the second layer. The first overlay marks 310 may include a plurality of lines which extend along an X direction and are spaced apart at regular intervals along a Y direction and a plurality of lines which extend along the Y direction and are spaced apart at regular intervals along the X direction. Shapes and arrangements of the second and third overlay marks 320 and 330 may be identical or analogous to those of the first overlay marks 310. The first to third overlay marks 310 to 330 may be horizontally spaced apart from each other and might not vertically overlap with each other.

A first image corresponding to the first overlay marks 310 may be acquired based on light having a first wavelength. A second image corresponding to the second overlay marks 320 may be acquired based on light having a second wavelength. A third image corresponding to the third overlay marks 330 may be acquired based on light having a third wavelength. A combined image may be acquired by overlapping at least two of the first to third images. An overlay error may be determined by calculating displacements between at least two image centers of the overlapped two images. The first to third wavelengths may be different. For example, the second wavelength may be shorter than the first wavelength, and the third wavelength may be shorter than the second wavelength. Alternatively, the first wavelength may be shorter than the second wavelength, and the second wavelength may be shorter than the third wavelength. The second wavelength may be shorter than the first and third wavelengths, and one of the first and third wavelengths may be longer or shorter than the other.

According to exemplary embodiments of the present inventive concept, variation of light wavelength depending on the position of the overlay mark may increase image clarity. Accordingly, reliable determinations of overlay errors may increase yield and improve electrical characteristics of semiconductor devices. Moreover, overlay errors may be monitored in real time and the occurrence of manufacturing errors may be reduced.

While the inventive concept has been particularly shown and described with reference to exemplary embodiments thereof, it will be understood by those of ordinary skill in the art that various changes in form and detail may be made therein without departing from the spirit and scope of the present inventive concept as defined by the following claims.

What is claimed is:

1. A method for measuring overlay, the method comprising:
    receiving a first image of a first overlay mark selectively captured using light having a first wavelength in a first step;
    receiving a second image of a second overlay mark selectively captured using light having a second wavelength different from the first wavelength in a second step different from the first step; and
    measuring a displacement between a central portion of the first image and a central portion of the second image, wherein the first and second overlay marks are disposed on different levels,
    wherein:
    the first overlay mark comprises a plurality of first zones comprising a first pattern disposed along an x direction, a second pattern disposed along a y direction, a third pattern disposed along the x direction and a fourth pattern disposed along the y direction, wherein the first through fourth patterns are rotationally symmetric around a center of the first overlay mark, and
    the second overlay mark comprises a plurality of second zones comprising a fifth pattern disposed along an x direction, a sixth pattern disposed along a y direction, a seventh pattern disposed along the x direction and an eighth pattern disposed along the y direction, wherein the fifth through eighth patterns are rotationally symmetric around a center of the second overlay mark, and
    wherein the first overlay mark and the second overlay mark are each positioned in a single continuous layer separating the first overlay mark from the second overlay mark.

2. The method of claim 1, wherein the first zones are horizontally spaced apart from the second zones.

3. The method of claim 2, wherein the first zones do not vertically overlap with the second zones.

4. The method of claim 3, wherein the first through fourth patterns are symmetrically disposed +90°, 180°, 270° and 360° around the center of the first overlay mark.

5. The method of claim 4, wherein the fifth through eighth patterns are symmetrically disposed +90°, 180°, 270° and 360° around the center of the second overlay mark.

6. The method of claim 1, wherein the single continuous layer is disposed on side and upper surfaces of the first overlay mark, and wherein the single continuous layer is disposed on side and bottom surfaces of the second overlay mark.

7. A method for measuring overlay, the method comprising:
    receiving a first image corresponding to a first overlay mark selectively captured using light having a first wavelength in a first step, the first overlay mark disposed on a first layer of a wafer;
    receiving a second image corresponding to a second overlay mark selectively captured using light having a second wavelength different from the first wavelength in a second step different from the first step, the second overlay mark disposed on a second layer over the wafer;
    receiving a combined image in which the first and second images are overlapped; and
    calculating a displacement between a central portion of the first image and a central portion of the second image in the combined image to measure an overlay between the first overlay mark and the second overlay mark,
    wherein:
    the first overlay mark comprises a plurality of first zones comprising a first pattern disposed along an x direction, a second pattern disposed along a y direction, a third pattern disposed along the x direction and a fourth pattern disposed along the y direction, wherein the first through fourth patterns are rotationally symmetric around a center of the first overlay mark, and
    the second overlay mark comprises a plurality of second zones comprising a fifth pattern disposed along an x direction, a sixth pattern disposed along a y direction, a seventh pattern disposed along the x direction and an eighth pattern disposed along the y direction, wherein the fifth through eighth patterns are rotationally symmetric around a center of the second overlay mark, and wherein the first overlay mark and the second overlay mark are each positioned in a single continuous layer separating the first overlay mark from the second overlay mark.

8. The method of claim 7, wherein the first zones are horizontally spaced apart from the second zones.

9. The method of claim 8, wherein the first zones do not vertically overlap with the second zones.

10. The method of claim 9, wherein the first through fourth patterns are symmetrically disposed +90°, 180°, 270° and 360° around the center of the first overlay mark.

11. The method of claim 10, wherein the fifth through eighth patterns are symmetrically disposed +90°, 180°, 270° and 360° around the center of the second overlay mark.

12. The method of claim 7, wherein the first overlay mark is disposed on the first layer that corresponds to a scribe lane of the wafer, and the second overlay mark is disposed on the second layer that corresponds to the scribe lane of the wafer.

13. The method of claim 7, wherein one of the first and second overlay marks is horizontally spaced apart from the other and is not vertically overlapped with the other.

14. The method of claim 7, wherein the second layer is directly on the first layer.

15. The method of claim 7, wherein the first overlay mark comprises a plurality of first parallel lines that are spaced apart, and the second overlay mark comprises a plurality of second parallel lines that are spaced apart.

16. The method of claim 15, wherein capturing the first image comprises:
    selecting the first parallel lines; and
    obtaining an image of the first parallel lines using the light having the first wavelength.

17. The method of claim 15, wherein capturing the second image comprises:
    selecting the second parallel lines; and
    obtaining an image of the second parallel lines using the light having the second wavelength.

18. A method for measuring overlay, the method comprising:
    receiving a first image of a first overlay mark selectively captured using light having a first wavelength in a first step;
    receiving a second image of a second overlay mark selectively captured using light having a second wavelength different from the first wavelength in a second step different from the first step; and
    measuring a displacement between a central portion of the first image and a central portion of the second image,
    wherein the first and second overlay marks are disposed on different levels,
    wherein the first overlay mark comprises a plurality of first zones comprising a first pattern disposed along an x direction, a second pattern disposed along a y direction, a third pattern disposed along the x direction and a fourth pattern disposed along the y direction, and wherein the first through fourth patterns are rotationally symmetric around a center of the first overlay mark, and
    wherein the second overlay mark comprises a plurality of second zones comprising a fifth pattern disposed along an x direction, a sixth pattern disposed along a y direction, a seventh pattern disposed along the x direction and an eighth pattern disposed along the y direction, and wherein the fifth through eighth patterns are rotationally symmetric around a center of the second overlay mark,
    wherein the first overlay mark is disposed on a lower level than the second overlay mark and the first wavelength is shorter than the second wavelength.

* * * * *